United States Patent
Liou

(10) Patent No.: US 8,928,412 B2
(45) Date of Patent: Jan. 6, 2015

(54) PRECISE CURRENT SOURCE CIRCUIT FOR BIAS SUPPLY OF RF MMIC GAIN BLOCK AMPLIFIER APPLICATION

(71) Applicant: Microelectronics Technology, Inc., Hsinchu (TW)

(72) Inventor: Ming Che Liou, Hsinchu (TW)

(73) Assignee: Microelectronics Technology, Inc., Hsinchu (TW)

( * ) Notice: Subject to any disclaimer, the term of this patent is extended or adjusted under 35 U.S.C. 154(b) by 103 days.

(21) Appl. No.: 13/846,409

(22) Filed: Mar. 18, 2013

(65) Prior Publication Data

US 2014/0197890 A1    Jul. 17, 2014

Related U.S. Application Data

(60) Provisional application No. 61/753,510, filed on Jan. 17, 2013.

(51) Int. Cl.
*H03G 3/20* (2006.01)
*H03F 1/30* (2006.01)
*H03F 3/24* (2006.01)

(52) U.S. Cl.
CPC ............... *H03F 1/302* (2013.01); *H03F 3/245* (2013.01)
USPC .......................................... 330/285; 330/296

(58) Field of Classification Search
USPC ..................... 330/297, 127, 129, 134, 279
See application file for complete search history.

(56) References Cited

U.S. PATENT DOCUMENTS

| | | | |
|---|---|---|---|
| 6,043,711 A | 3/2000 | Kim | |
| 6,166,591 A | 12/2000 | Schultz et al. | |
| 6,559,723 B2 | 5/2003 | Hollenbeck et al. | |
| 6,998,920 B2 | 2/2006 | Krutko et al. | |
| 7,098,741 B2 * | 8/2006 | Litwin et al. | 330/297 |
| 8,164,389 B2 | 4/2012 | Sun et al. | |
| 2005/0083128 A1 | 4/2005 | Chan et al. | |
| 2011/0156834 A1 | 6/2011 | Atsumi | |
| 2014/0118074 A1 * | 5/2014 | Levesque et al. | 330/296 |

OTHER PUBLICATIONS

Fairchild Semiconductor Corporation, Product Specification: BC846-BC850 (NPN Epitaxial Silicon Transistor) Rev. B1, Apr. 2011.
TriQuint Semiconductor, Inc. Product Specification: TQP7M9101 ¼W High Linearity Amplifier, Data Sheet: Rev E Dec. 19, 2011.
TriQuint Semiconductor, Inc. Product Specification: TQP3M9009 High Linearity LNA Gain Block, Data Sheet: Rev G Dec. 27, 2011.
Freescale Semiconductor, Inc. Technical Data: Heterojunction Bipolar Transistor Technology (InGaP HBT) Broadband High Linearity Amplifier. Document No. MMG3014NT1 Rev. 3, Oct. 2011.

* cited by examiner

*Primary Examiner* — Hieu Nguyen
(74) *Attorney, Agent, or Firm* — WPAT, P.C.; Anthony King

(57) ABSTRACT

A current source circuit includes a first transistor Q1, a second transistor Q2, a first resistor R1, and a second resistor R2. The first transistor Q1 has a first terminal (collector) coupled with the supply voltage (VCC), a second terminal (base) coupled with the first resistor R1, and a third terminal (emitter) coupled with the second resistor R2. The second transistor Q2 has a first terminal coupled with the second terminal of the first transistor Q1, a second terminal coupled with the third terminal of the first transistor Q1, and a third terminal coupled with the filtering circuit 39. The first resistor R1 is coupled between the supply voltage and a second terminal of the first transistor Q1. The second resistor R2 is coupled between a third terminal of the first transistor Q1 and the filtering circuit 39.

23 Claims, 15 Drawing Sheets

PRECISE CURRENT SOURCE CIRCUIT FOR BIAS SUPPLY OF RF MMIC GAIN BLOCK AMPLIFIER APPLICATION

FIELD OF THE INVENTION

The present disclosure relates to a current source circuit, and more particularly, to a current source circuit for an MMIC gain block amplifier capable of limiting an amplifier's output power without clipping the waveform PAR, but limiting the averaged power for the MMIC gain block amplifier application, so as to prevent the occurrence of over-drive or over-power inputs to the subsequent stage amplifier.

DISCUSSION OF THE BACKGROUND

As the 3G/4G wireless communication system requires high linearity and high efficiency performance on power amplifier modules, the higher power back-off designs on the front stage, or driver stage improve linearity to drive the final stage amplifier. This higher power back-off mode will operate the MMIC (Monolithic Microwave Integrated Circuit) gain block amplifier at $P_{1\,dB}$-10 dB or provide a more powerful back-off point on the front stage's nominal operation point in a 3G/4G wireless communication system. Traditionally, after system CFR (Crest factor reduction) functions, the waveform PAR (Peak-to-Average Power ratio) will reach between 6 dB to 8 dB PAR and acquires more linear margins for the front stage's back-off at this linear operation region by the MMIC gain block amplifier's AM-AM (Amplitude Modulation-Amplitude Modulation) response properties.

This RF (Radio Frequency) front stage's $P_{1\,dB}$ (1 dB compression point) back-off mode can drive an efficient linearity with a higher back-off. However, this may also cause a disadvantage by increasing the margins of the MMIC amplifier's output power capability. As such, the front stage amplifier will have the power capability to output more averaged power within the 6 to 8 dB PAR waveforms. It is also possible to over-drive the final stage amplifier, and damage the final stage amplifier by outputting too much power in many abnormal operations, or system loop fails. In such a situation, the loop either fails, produces incorrect operations, or creates a mismatch on the DPD (Digital Pre-Distortion) feedback loop, or a divergent DPD by non-predistortion amplifier characteristics. It consistently over-drives the amplifier quickly before the amplifier, or system, detects the error and shuts down. This over-drive takes only a period between nanoseconds and microseconds, and damages the final stage amplifier.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a current source circuit for an MMIC gain block amplifier capable of limiting an amplifier's output power without clipping the waveform PAR, but limiting the averaged power for the MMIC gain block amplifier application, so as to prevent the occurrence of the over-drive or over-power inputs to the subsequent stage amplifier.

A current source circuit according to this aspect of the present disclosure comprises a first transistor having a first terminal coupled with a supply voltage; a first resistor coupled between the supply voltage and a second terminal of the first transistor; a second resistor coupled between a third terminal of the first transistor and an output node; and a second transistor having a first terminal coupled with the second terminal of the first transistor, and a second terminal coupled with the third terminal of the first transistor.

A radio frequency signal amplification system according to this aspect of the present disclosure comprises an amplifier having an input terminal and an output terminal; a filtering circuit coupled with the output terminal; and a current source circuit configured to supply an operation current to the output terminal of the amplifier through the filtering circuit. In one embodiment of the present disclosure, the current source circuit comprises a first transistor having a first terminal coupled with a supply voltage; a first resistor coupled between the supply voltage and a second terminal of the first transistor; a second resistor coupled between a third terminal of the first transistor and the filtering circuit; and a second transistor having a first terminal coupled with the second terminal of the first transistor, and a second terminal coupled with the third terminal of the first transistor.

A radio frequency signal amplification system according to this aspect of the present disclosure comprises an amplifier having an input terminal and an output terminal; a filtering circuit coupled with the output terminal; and a current source circuit coupled between a supply voltage and the filtering circuit and configured to supply an operation current to the output terminal of the amplifier through the filtering circuit; wherein the current source circuit is configured to limit an average of the operation current, but not to exceed a setting level of the amplifier, and supply a peak current for radio frequency pulse operations of the amplifier.

The radio frequency signal amplification system with the current source circuit according to the embodiment of the present invention can function to decrease the bias voltage (Vbias) of the MMIC gain block amplifier as the operation current (Id) increases. In addition, the current source circuit of the radio frequency signal amplification system can also function to effectively and substantially limit the operation current (Id) of the MMIC gain block amplifier in order to not exceed the maximum quiescent current (Idq) of a conventional gain block amplifier.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

The present disclosure is directed to a precise current source circuit for bias supply of an RF MMIC gain block amplifier application. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

One embodiment of the present invention introduces a new design on the front stage's RF amplifier protection mode by limiting the amplifier's output power capability without clipping the waveform PAR, but also by limiting the averaged power for the MMIC gain block amplifier application, so as to prevent the occurrence of over-drive or over-power inputs to the subsequent stage amplifier.

Figure 1:
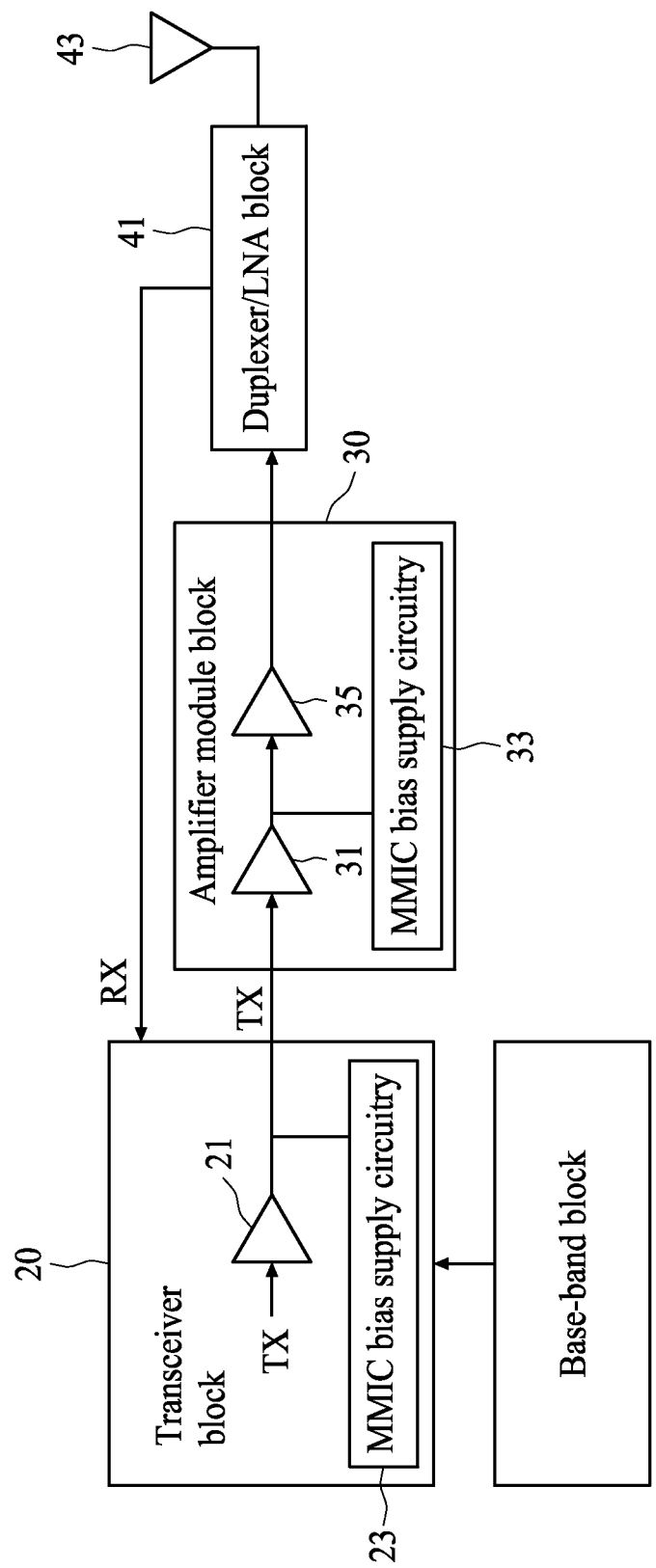
FIG. 1 shows an RF lineup block diagram to amplify the RF signals.

FIG. 1 shows an RF lineup block diagram to amplify the RF signals from the transceiver block 20 to the amplifier module block 30 and radiated to the antenna 43 through the duplexer/LNA (Low Noise Amplifier) block 41. The transceiver block 20 includes an MMIC gain block amplifier 21 and an MMIC bias supply circuitry 23, and the amplifier module block 30 includes an MMIC gain block amplifier 31, an MMIC bias supply circuitry 33, and a high power amplifier 35. The MMIC gain block amplifier 31 of the amplifier module block 30 is connected to the output of the MMIC gain block amplifier 21 of the transceiver block 20. Some applications may use two or more MMIC gain block amplifiers in parallel to generate more power with higher linearity. An exemplary gain block amplifier for the MMIC gain block amplifier 21 and the MMIC gain block amplifier 31 is MMG3014NT1 supplied by Freescale Semiconductor, Inc. or TQP7M9101 supplied by TriQuint Semiconductor, Inc.

The MMIC gain block amplifier 31 with lower noise and higher gain is used to provide the medium power strength between 20-27 dBm at the $P_{1\ dB}$. Such power level is enough to drive some class AB LDMOS (laterally diffused metal oxide semiconductor) power transistors to provide an averaged power output capability of 30-40 dBm with acceptable distortion and spectrum re-growth in spectrum emission requirements. For linear operation of the MMIC gain block amplifier 31 in class-A amplifier, its current consumption will be very close to the Idq (quasi-current) drains at a 0-15 dBm output level in the linear region, which is the steady state current consumption. During higher power outputs that are too close to the saturated region, the MMIC gain block amplifier 31 consumes more current over this linear range.

Figure 2:
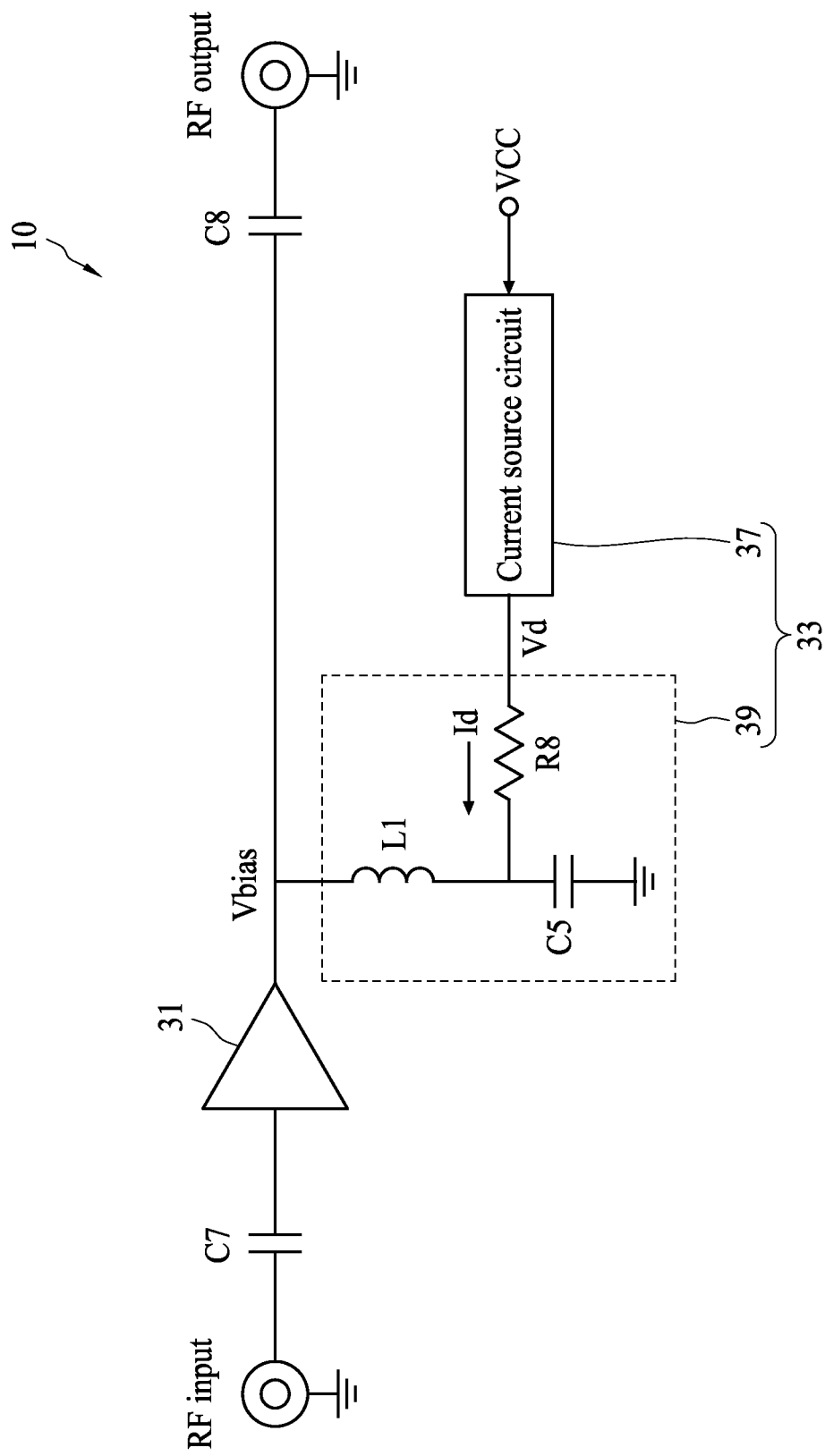
FIG. 2 illustrates a radio frequency signal amplification system according to one embodiment of the present invention.

FIG. 2 illustrates a radio frequency signal amplification system 10 according to one embodiment of the present invention, wherein the MMIC gain block amplifier 31 and the MMIC bias supply circuitry 33 are used as exemplary embodiments. It should be appreciated by those skilled in the art that the MMIC gain block amplifier 21 and the MMIC bias supply circuitry 23 may use the same design. In one embodiment of the present invention, the MMIC bias supply circuitry 33 comprises a filtering circuit 39 and a current source circuit 37, wherein the filtering circuit 39 is coupled with the output terminal of the MMIC gain block amplifier 31, and the current source circuit 37 is coupled between the system supply voltage (VCC) and the filtering circuit 39.

In one embodiment of the present disclosure, the filtering circuit 39 includes an inductor L1, a capacitor C5, and a resistor R8, configured to filter noise transmitted from the current source circuit 37 to the MMIC gain block amplifier 31. In addition, the filtering circuit 39 also functions to prevent high frequency signal from transmitting into the current source circuit 37. In one embodiment of the present disclosure, the current source circuit 37 is configured to supply an operation current to the output terminal of the MMIC gain block amplifier 31 through the filtering circuit 39, wherein the current source circuit 37 is also configured to limit an average of the operation current in order to not exceed a setting level of the amplifier MMIC gain block 31, and supply a peak current for radio frequency pulse operations of the MMIC gain block amplifier 31.

Figure 3:
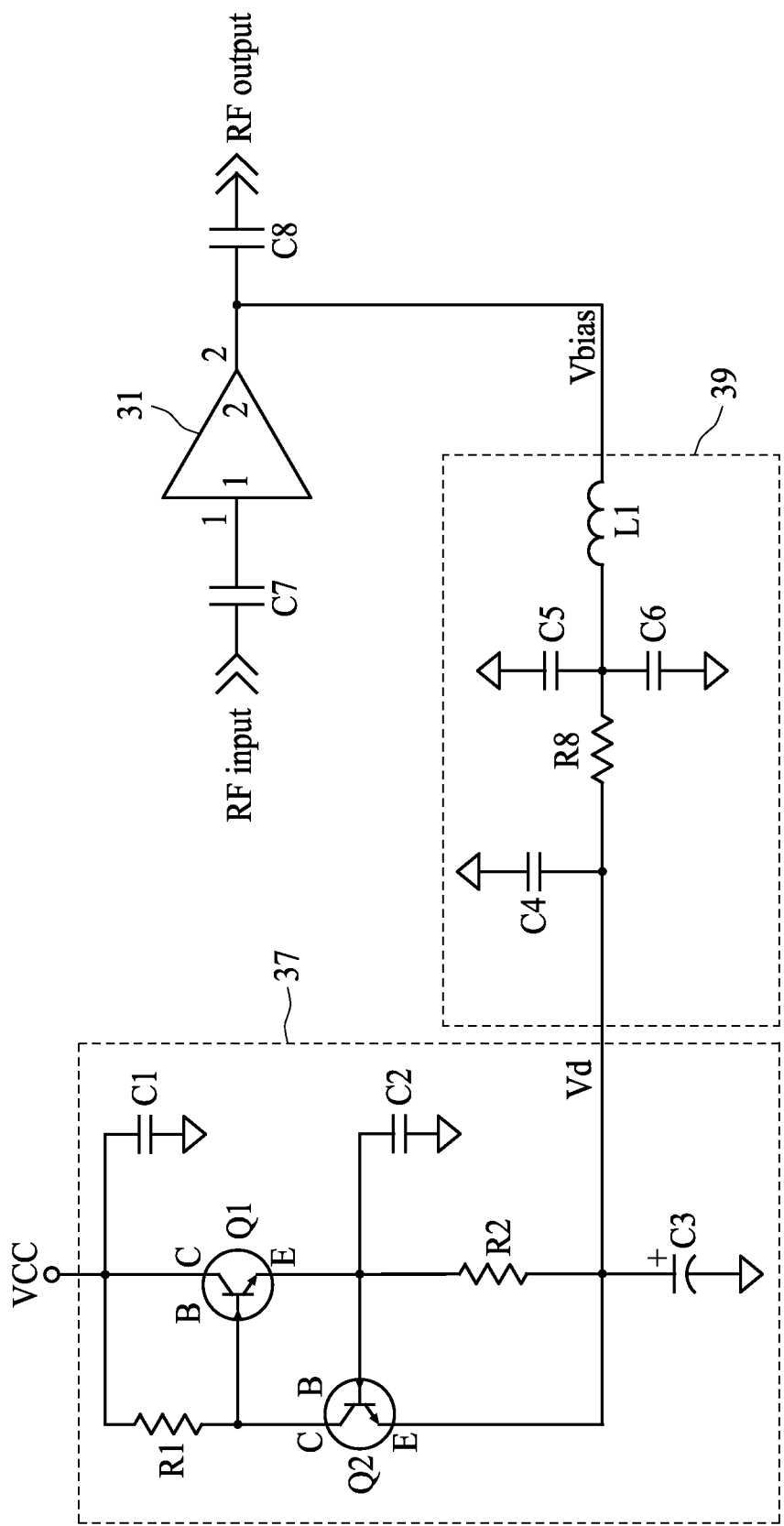
FIG. 3 illustrates the current source circuit according to one embodiment of the present invention.

FIG. 3 illustrates the current source circuit 37 according to one embodiment of the present invention. In one embodiment of the present invention, the current source circuit 37 comprises a first transistor Q1, a second transistor Q2, a first resistor R1, and a second resistor R2. Examples of transistors (Q1, Q2) that can be used in the current source circuit 37 described herein can include, but are not limited to, a heterojunction bipolar transistor (HBT) and field effect transistor (FET). In the embodiment shown in FIG. 3, the current source circuit 37 utilizes the characteristic of finite current through collectors and emitters by a series of NPN transistors (Q1, Q2). The resistors (R1, R2) are used for the base-biasing of the NPN transistors (Q1, Q2) to the Id through current setting, and drop down the voltage to the drain of the MMIC gain block amplifier 31 while the drain current is higher than the Id setting.

In one embodiment of the present invention, the first transistor Q1 has a first terminal (collector) coupled with the supply voltage (VCC), a second terminal (base) coupled with the first resistor R1, and a third terminal (emitter) coupled with the second resistor R2. The second transistor Q2 has a first terminal coupled with the second terminal of the first transistor Q1, a second terminal coupled with the third terminal of the first transistor Q1, and a third terminal coupled with the filtering circuit 39. The first resistor R1 is coupled between the supply voltage and a second terminal of the first transistor Q1. The second resistor R2 is coupled between a third terminal of the first transistor Q1 and the filtering circuit 39.

Figure 4:
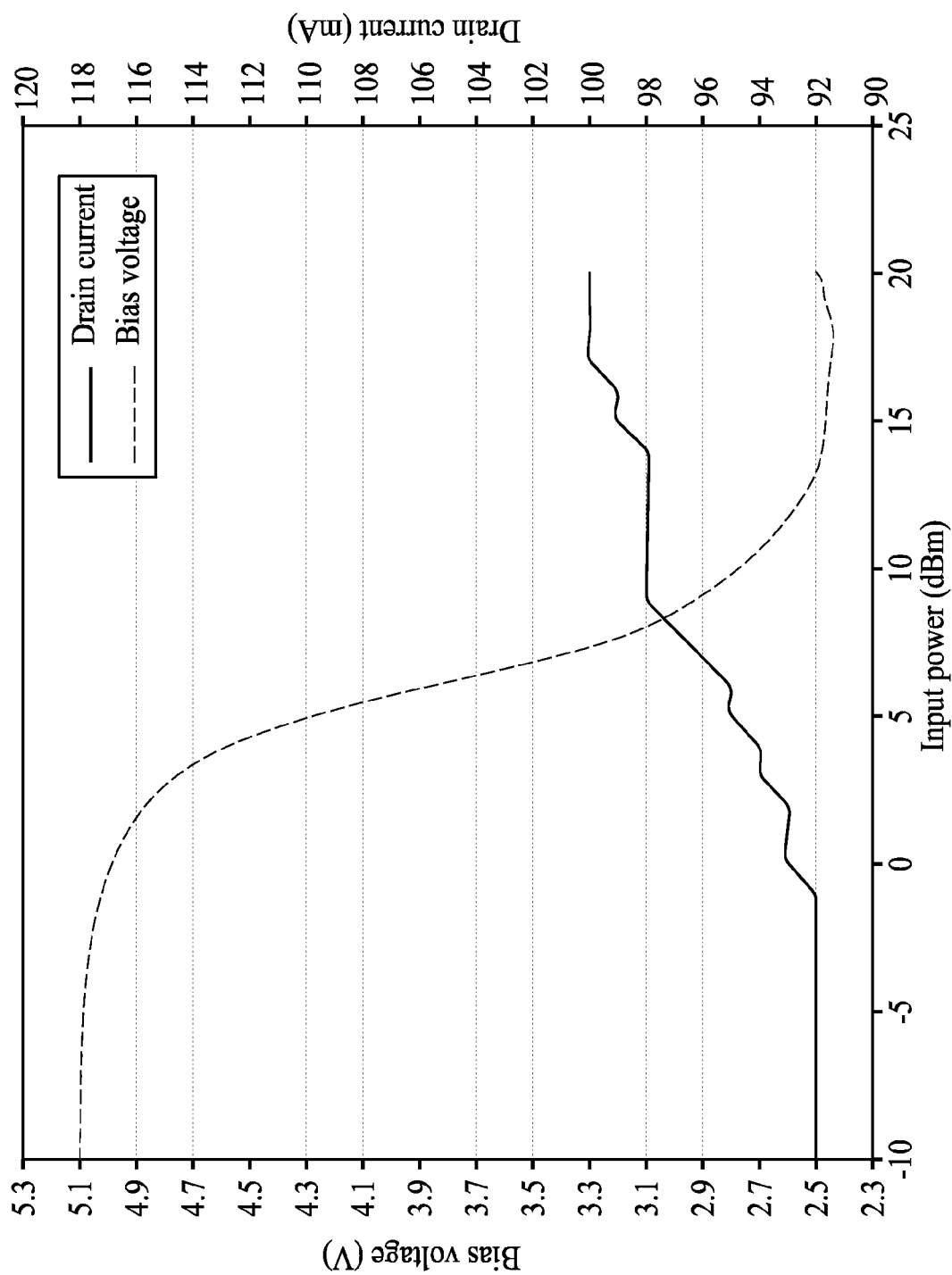
FIG. 4 is a measurement of the bias voltage (Vbias) and drain current (Id) of the MMIC gain block amplifier using the current source circuit in FIG. 3.

FIG. 4 is a measurement of the bias voltage (Vbias) and drain current (Id) of the MMIC gain block amplifier 31 using the current source circuit 37 in FIG. 3. As the operation current, i.e., the drain current (Id) of the MMIC gain block amplifier 31, increases, the emitter voltage of the first transistor Q1 and the base voltage of the second transistor Q2 must decrease correspondingly. Further, the emitting voltage (the output voltage of the current source circuit 37) of the second transistor Q2 must decrease as the base voltage of the second transistor Q2 decreases. As a result, the bias voltage (Vbias) of the MMIC gain block amplifier 31 will decrease correspondingly as the operation current (Id) increases. In particular, the operation current (Id) of the MMIC gain block amplifier 31 is substantially limited in order to not exceed 100 mA, as clearly shown in FIG. 4.

Figure 5:
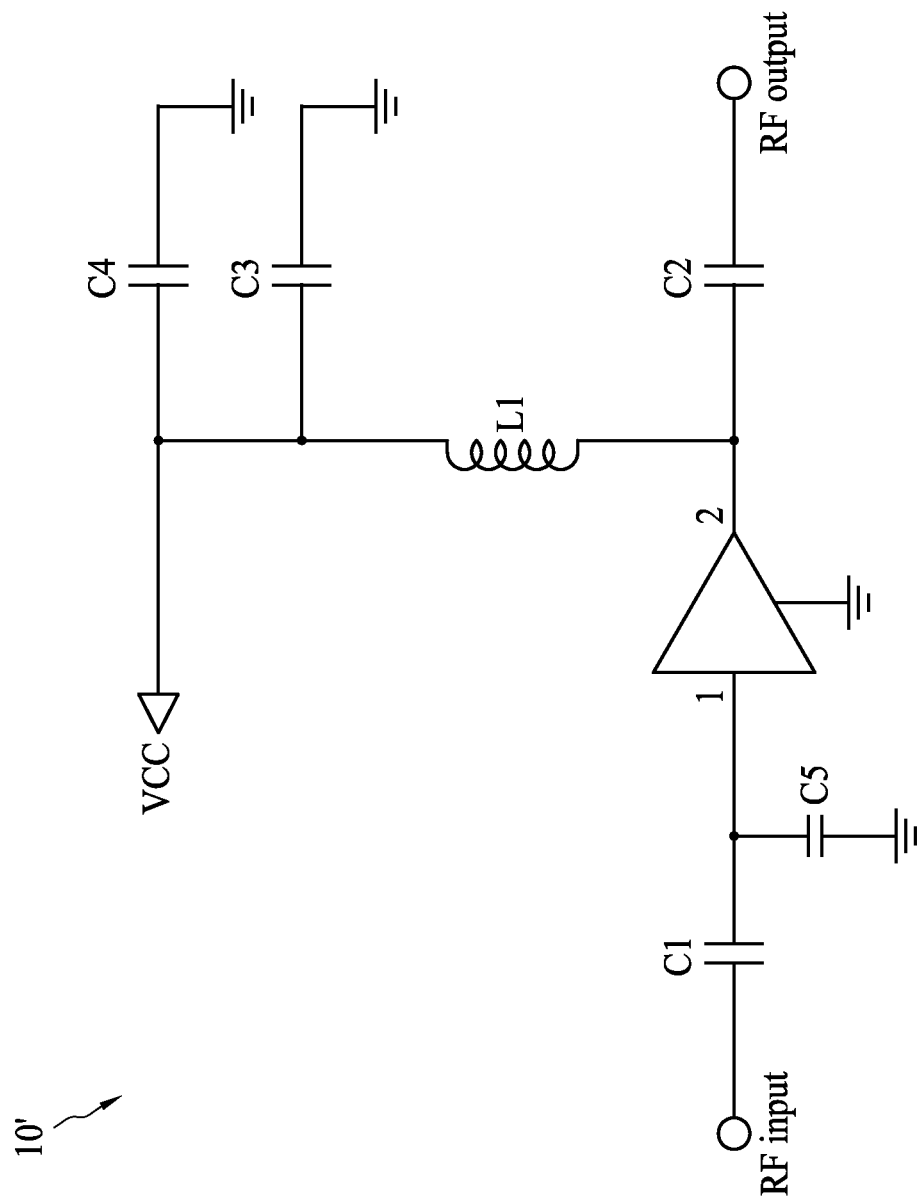
FIG. 5 illustrates a radio frequency signal amplification system according to one comparative embodiment of the present invention.
Figure 6:
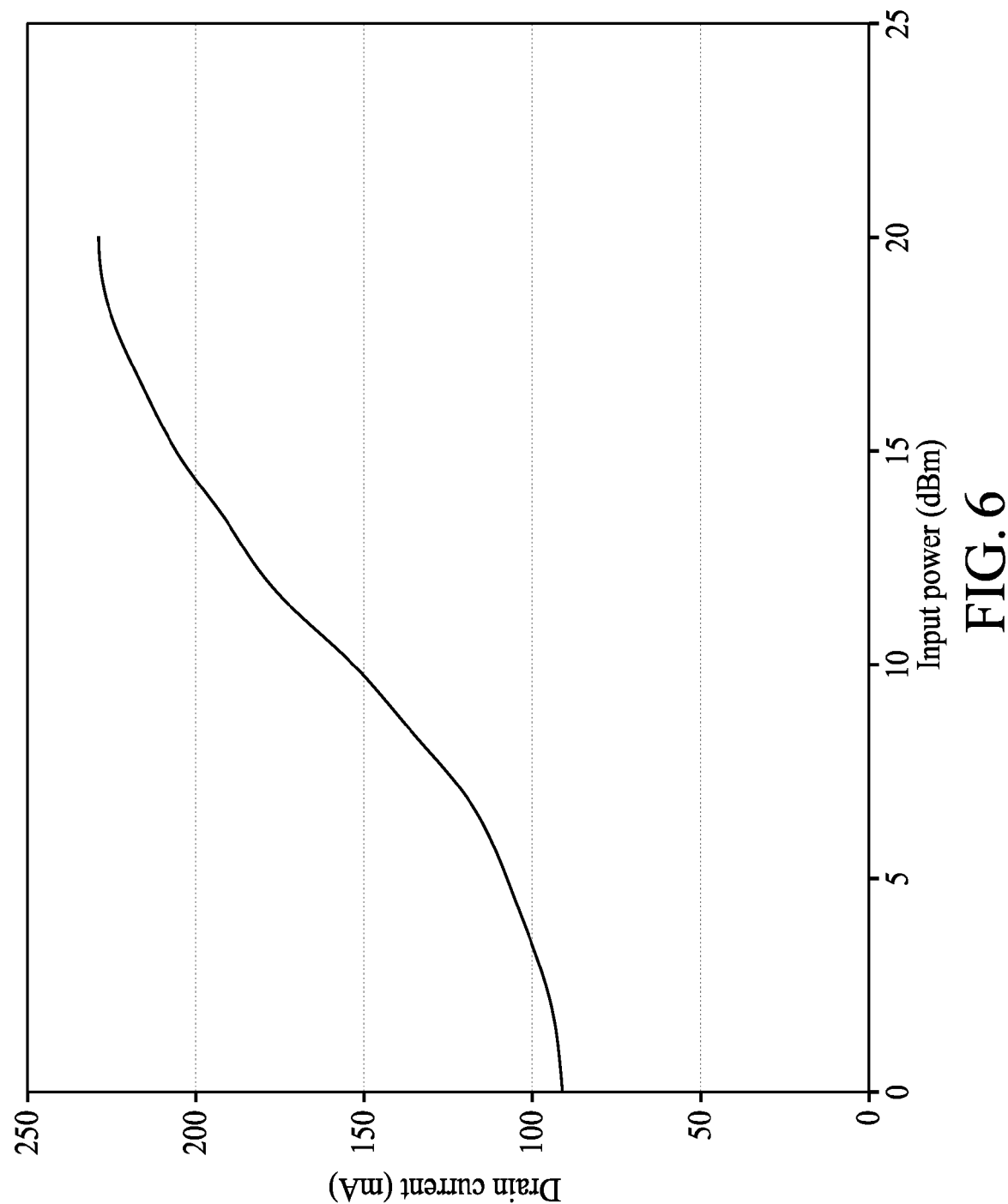
FIG. 6 is a measurement of the bias voltage (Vbias) and drain current (Id) of the MMIC gain block amplifier without a current source circuit in FIG. 5.

FIG. 5 illustrates a radio frequency signal amplification system 10' according to one comparative embodiment of the present invention, and FIG. 6 is a measurement of the bias voltage (Vbias) and drain current (Id) of the MMIC gain block amplifier 31 without a current source circuit. The quiescent current (Idq) of an amplifier is generally below 110 mA. For example, the maximum quiescent current of the high linearity amplifier TQP7M9101 (supplied by TriQuint Semiconductor, Inc) is about 105 mA. As clearly shown in FIG. 6, as the input power increases to 20 dBm, the operation current (Id) of the MMIC gain block amplifier 31 increases up to about 230 mA, which is much higher than the maximum quiescent current of the amplifier. In contrast, the radio frequency signal amplification system 10 with the current source circuit 37 shown in FIG. 3, according to one embodiment of the present invention, can effectively and substantially limit the operation current (Id) of the MMIC gain block amplifier 31 in order to not exceed 100 mA, as clearly shown in FIG. 4.

Figure 7:
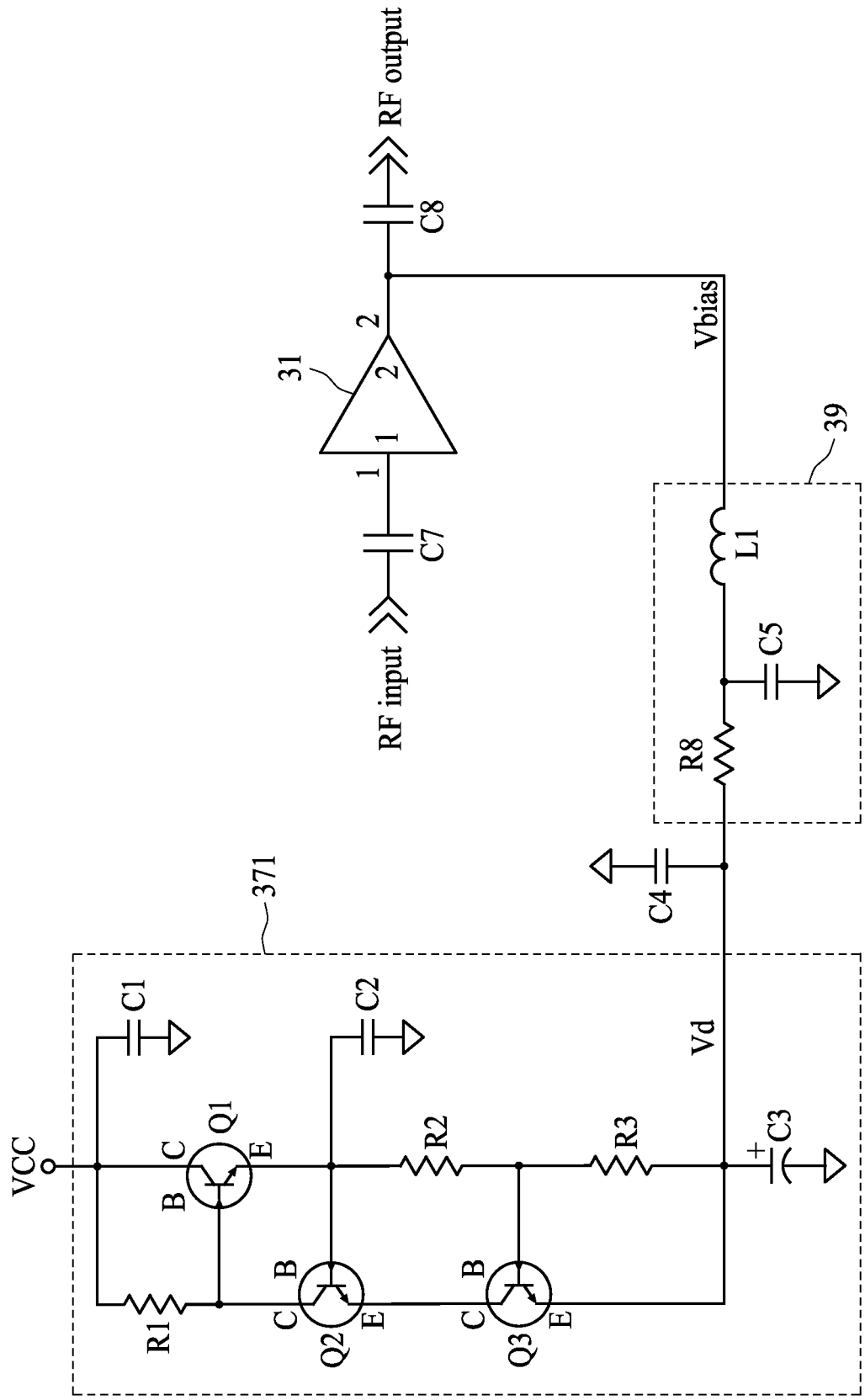
FIG. 7 illustrates the current source circuit according to another embodiment of the present invention.

FIG. 7 illustrates the current source circuit 371 according to another embodiment of the present invention. In another embodiment of the present invention, the current source circuit 371 comprises a first transistor Q1, a second transistor Q2, a third transistor Q3, a first resistor R1, a second resistor R2, and a third resistor R3. Examples of transistors that can be used in the current source circuit 371 described herein can include, but are not limited to, a heterojunction bipolar transistor (HBT) and field effect transistor (FET). In the embodiment shown in FIG. 7, the current source circuit 371 utilizes the characteristic of finite current through collectors and emitters by a series of NPN transistors (Q1, Q2, Q3). The resistors (R1, R2, R3) are used for the base-biasing of the NPN transistors (Q1, Q2, Q3) to the Id through current setting, and drop down the voltage to the drain of the MMIC gain block amplifier 31 while the drain current is higher than the Id setting.

In one embodiment of the present invention, the first transistor Q1 has a first terminal (collector) coupled with the supply voltage (VCC), a second terminal (base) coupled with the first resistor R1, and a third terminal (emitter) coupled with the second resistor R2. The second transistor Q2 has a first terminal coupled with the second terminal of the first transistor Q1, a second terminal coupled with the third terminal of the first transistor Q1, and a third terminal coupled with the third transistor Q3. The third transistor Q3 has a first terminal coupled with the third terminal of the second transistor Q2, a second terminal coupled with a node between the second transistor R2 and the third resistor R3, and a third terminal coupled with the filtering circuit 39. The first resistor R1 is coupled between the supply voltage and a second terminal of the first transistor Q1. The second resistor R2 and the third resistor R3 are connected in serial and coupled between a third terminal of the first transistor Q1 and the filtering circuit 39.

Figure 8:
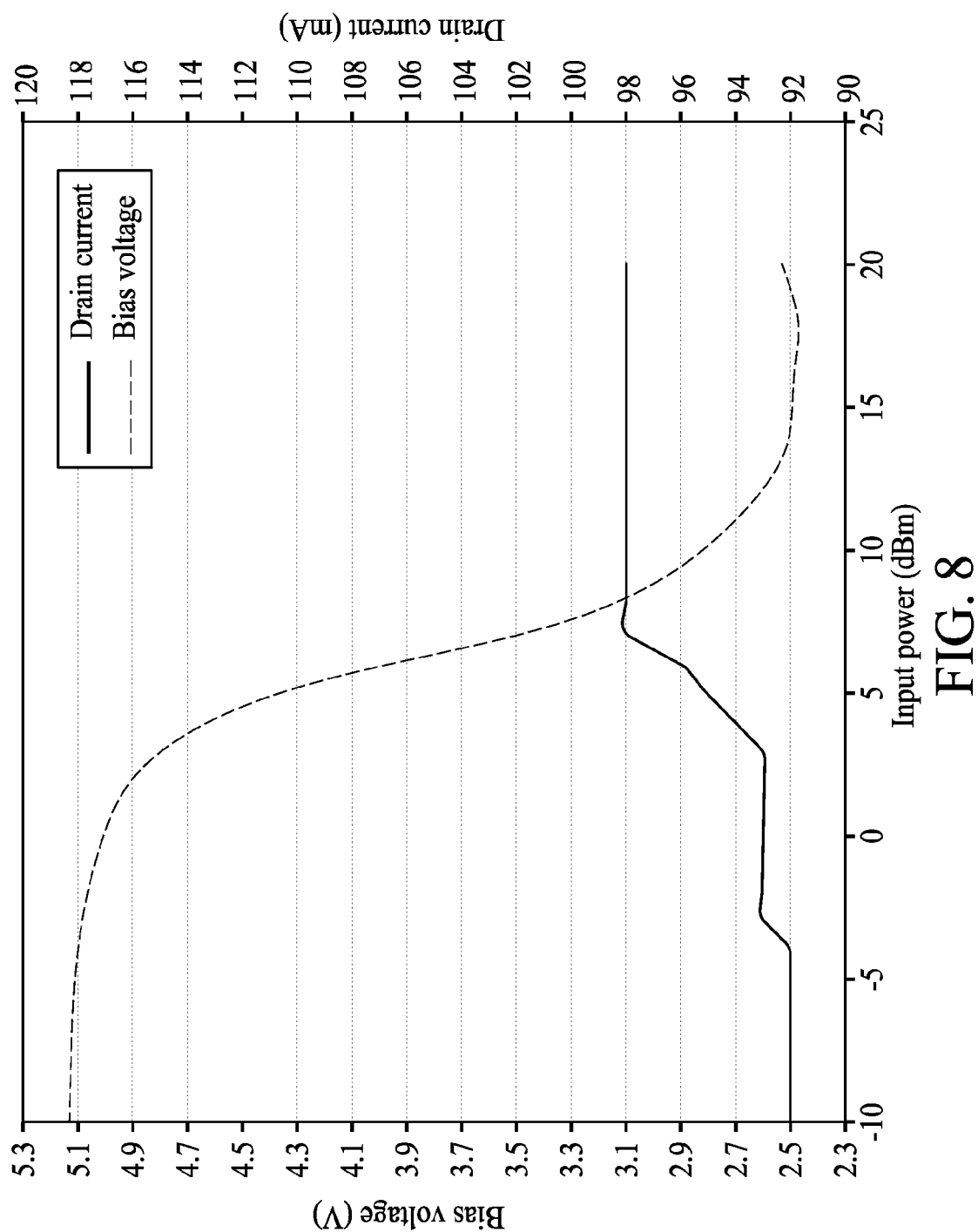
FIG. 8 is a measurement of the bias voltage (Vbias) and drain current (Id) of the MMIC gain block amplifier using the current source circuit in FIG. 7

FIG. 8 is a measurement of the bias voltage (Vbias) and drain current (Id) of the MMIC gain block amplifier 31 using the current source circuit 371 in FIG. 7. As shown in FIG. 8, the current source circuit 371 in FIG. 7 also possesses a similar function by decreasing the bias voltage (Vbias) of the MMIC gain block amplifier 31 as the operation current (Id) increases. In addition, the current source circuit 371 in FIG. 7 also possesses a similar function by effectively and substantially limiting the operation current (Id) of the MMIC gain block amplifier 31 in order to not exceed 100 mA, as clearly shown in FIG. 8.

During the linear region operation in a continuous wave (CW) or averaged power level, the MMIC drains the Idq current for its power capability with constant DC voltage. The peak power portion, or pulsed waveform, drains the inrush current by the capacitor's discharge. The current source circuit 37 and the current source circuit 371 are configured to maintain the MMIC's high peak power capability, while limiting the averaged power output. When the averaged input power increases, the MMIC drains more current to keep its gain and high output power. The high current will be limited by the bias supply circuit, and drops down its bias voltage. The MMIC has an internal voltage controls, to supply its FET gate voltage and keep its normal operating voltage when the external power supply is not stable. The external voltage drops down to its controller's lowest input limit and causes the MMIC to lower its output power capability. The current source circuit prevents the MMIC gain block amplifier from high and over outputs in averaged power, thereby avoiding high power injection to the high power transistors.

Figure 9:
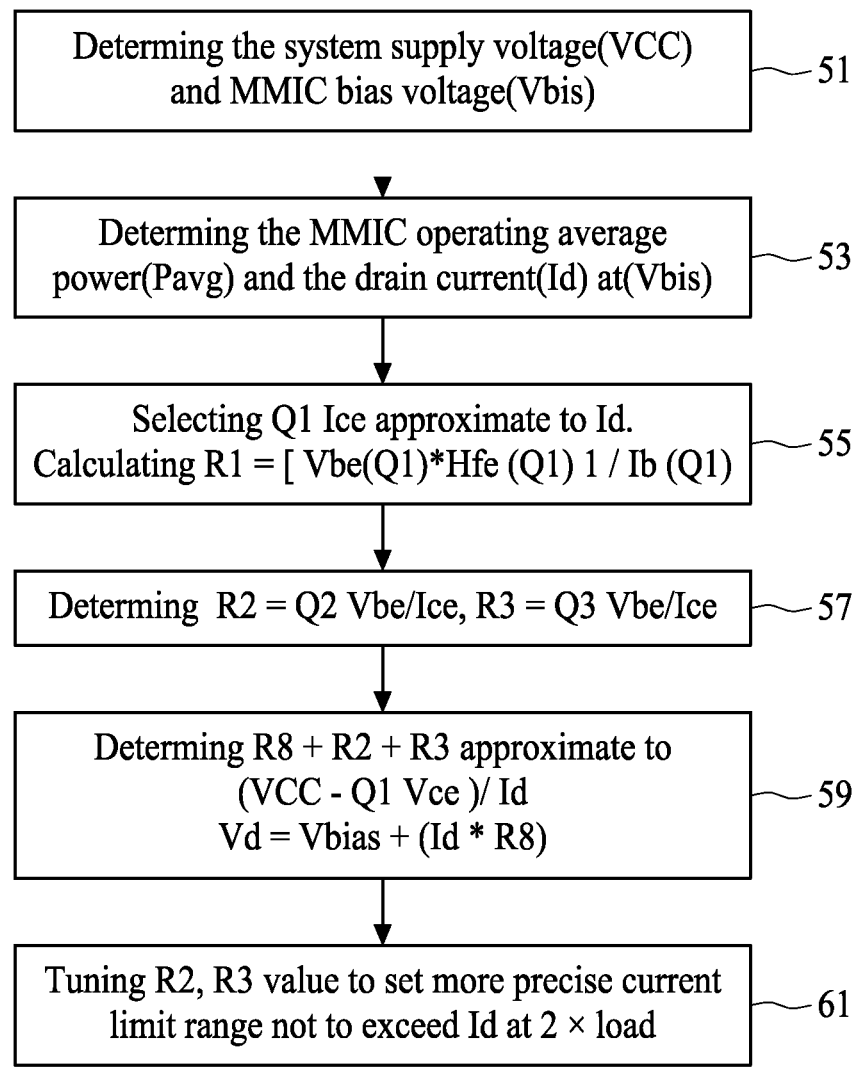
FIG. 9 shows the design flow 50 for the current source circuit for the MMIC gain block amplifier according to one embodiment of the present invention

FIG. 9 shows the design flow 50 for the current source circuit 371 of the MMIC gain block amplifier 31 according to one embodiment of the present invention. In the embodiment, an 880 MHz-2.5 Ghz band, 16 dB gain, Psat to 25 dBm, 5V biasing voltage, and current to 92 mA MMIC gain block amplifier is evaluated to apply the bias current source design. The MMIC gain block amplifier used in the amplifier module will increase to a nominal 12 dBm output power level with an 8 dB PAR multi-carrier WCDMA waveform by gain budget analysis. It is operated at a 13 dB power back-off as compared with its Psat to get a linear response and 5 dB peak power margins for DPD expansion.

The design flow 50 uses the heterojunction bipolar transistor (HBT) as the example, and can begin in step 51, which is performed to determine the system supply voltage (VCC) and the bias voltage (Vbias) of the MMIC gain block amplifier.

Step 53 is performed to determine the operating average power (Pavg) and the drain current (Id) at the bias voltage (Vbias).

In step 55, transistor Q1 with Ice approximate to Id is selected, and then the resistance of the resistor R1 is calculated by the following equation:

$$R1 = [Vbe(Q1) * Hfe(Q1)] / Ib(Q1).$$

In step 57, the resistances of the resistors R2 and R3 is calculated by the following equation:

$$R2 = Vbe(Q2)/Ice(Q2); R3 = Vbe(Q3)/Ice(Q3).$$

In step 59, the resistance of the resistor R8 is calculated by the following equation:

$$R8 = [VCC - Vce(Q1)] / Id - R2 - R3.$$

The resistor R8 can be implemented by several resistors connected in parallel.

In step 61, the resistance of the resistors R2 and R3 are tuned to set a more precise current source range in order to not exceed Id when the load is doubled.

Figure 10:
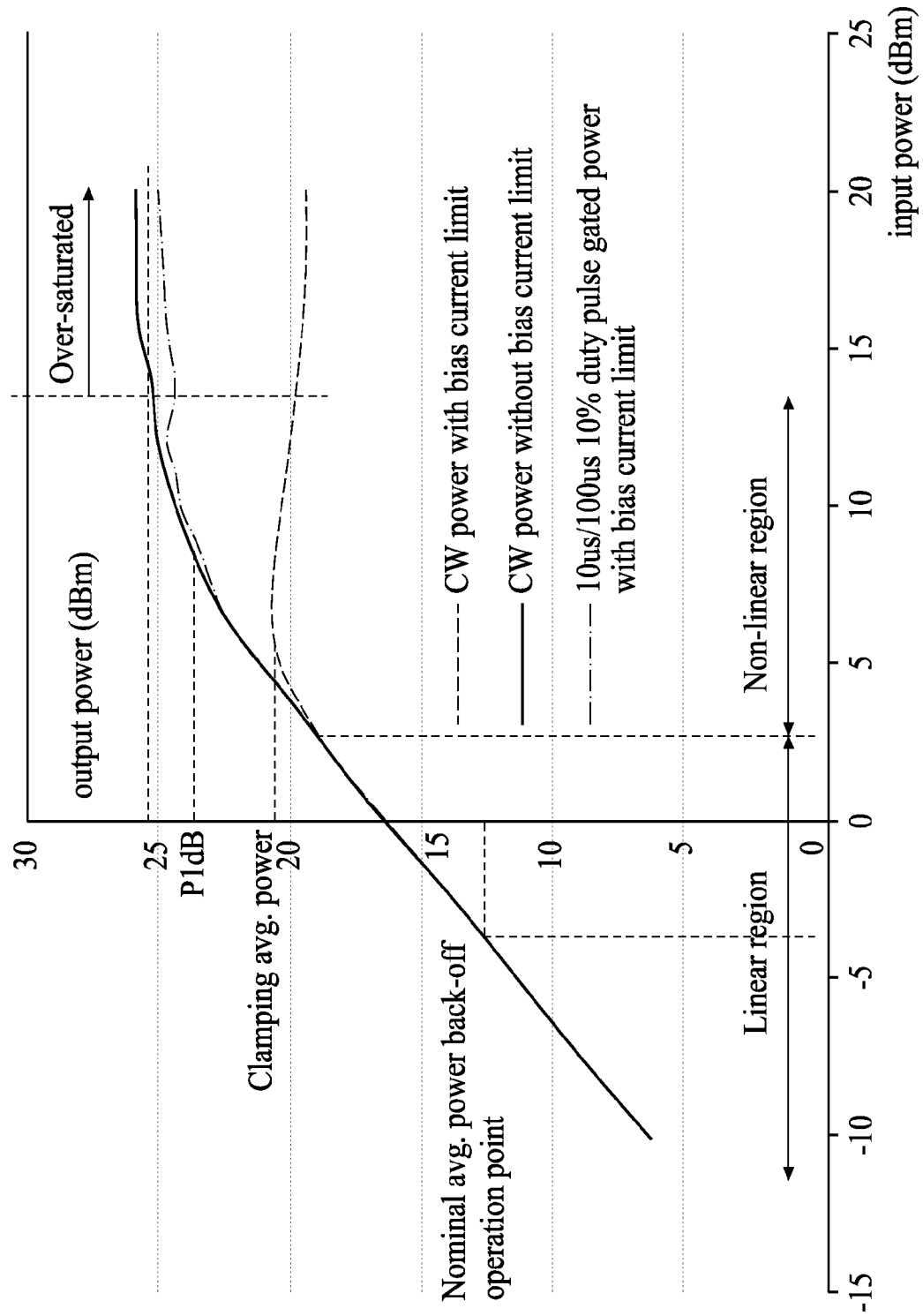
FIGS. 10-12 show the pulsed waveform testing results for the 10% duty in 40 us and 100 us.
Figure 11:
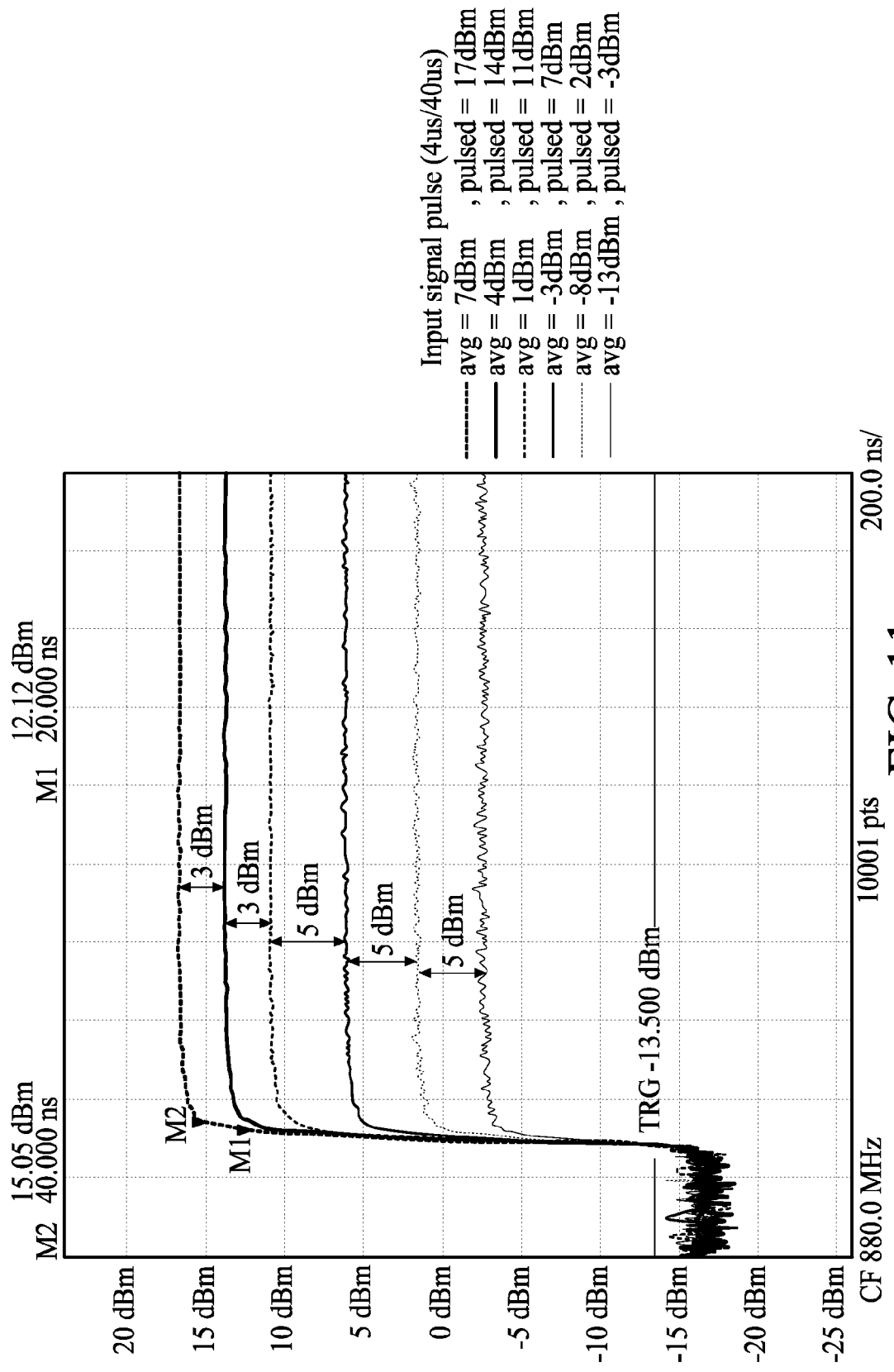
Figure 12:
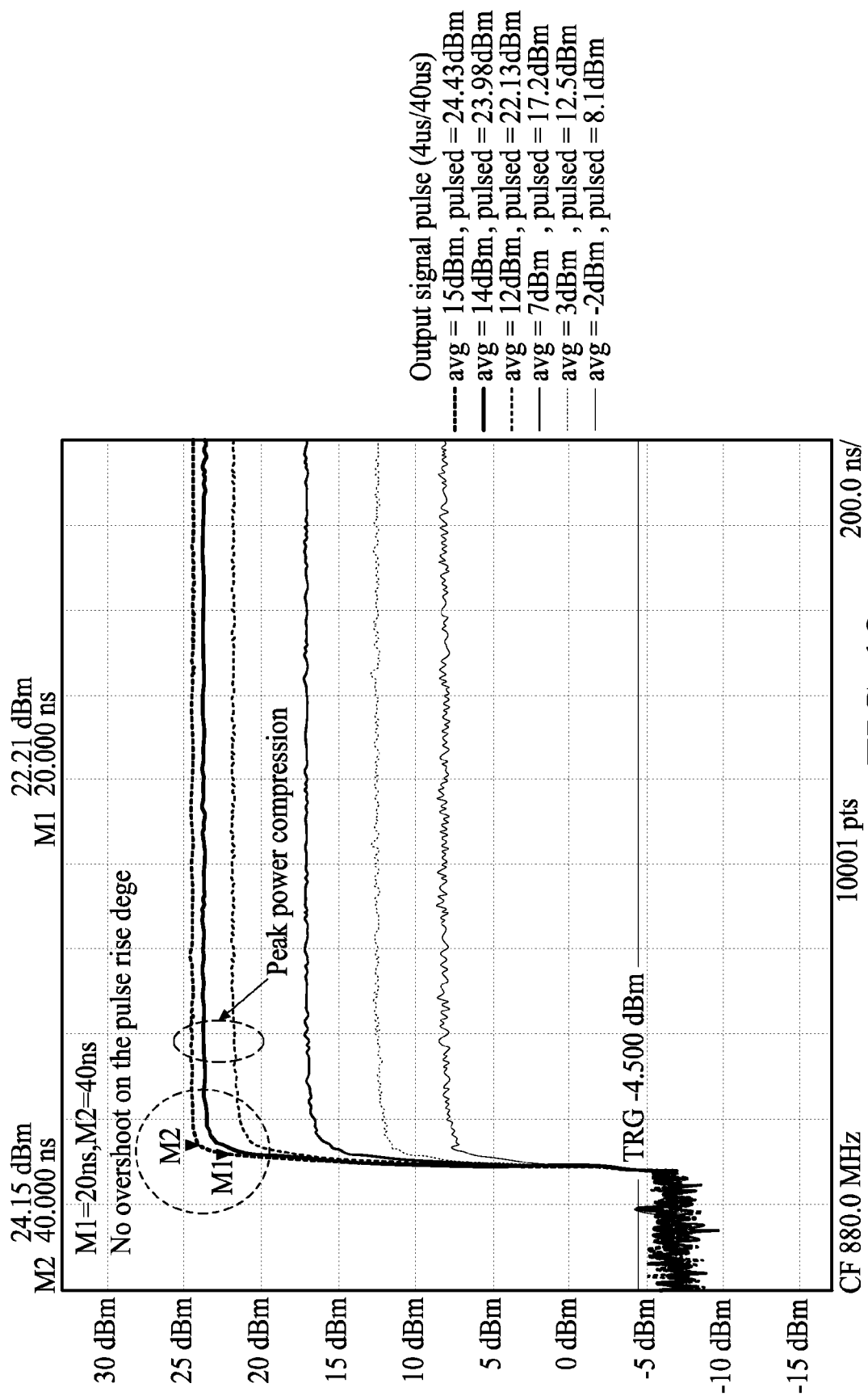

FIGS. 10-12 show the pulsed waveform testing results for the 10% duty in 40 us and 100 us. In FIG. 11, the nominal MMIC gain response in CW without a bias current source circuit is compared with the pulsed gain in the MMIC with a bias current source circuit. There are no significant differences from the original gain response, unless the MMIC gain block amplifier operates at the over-saturated region. In contrast, as compared with the MMIC CW response, the CW response demonstrates the continuous and averaged power gain plot. The MMIC with a bias current source circuit compresses the averaged power level when the drain current is over the designed current source setting. The averaged power is clamped and limited below the maximum 20 dBm output. For the nominal output power to the 12 dBm condition, MMIC gain block amplifier has an 8 dB margin to over-drive the amplifier module with a linear gain response. After the 8 dB plus power inputs, the MMIC constrains its power at 20 dBm to protect the final stage amplifier from over-driving and being damaged.

Figure 13:
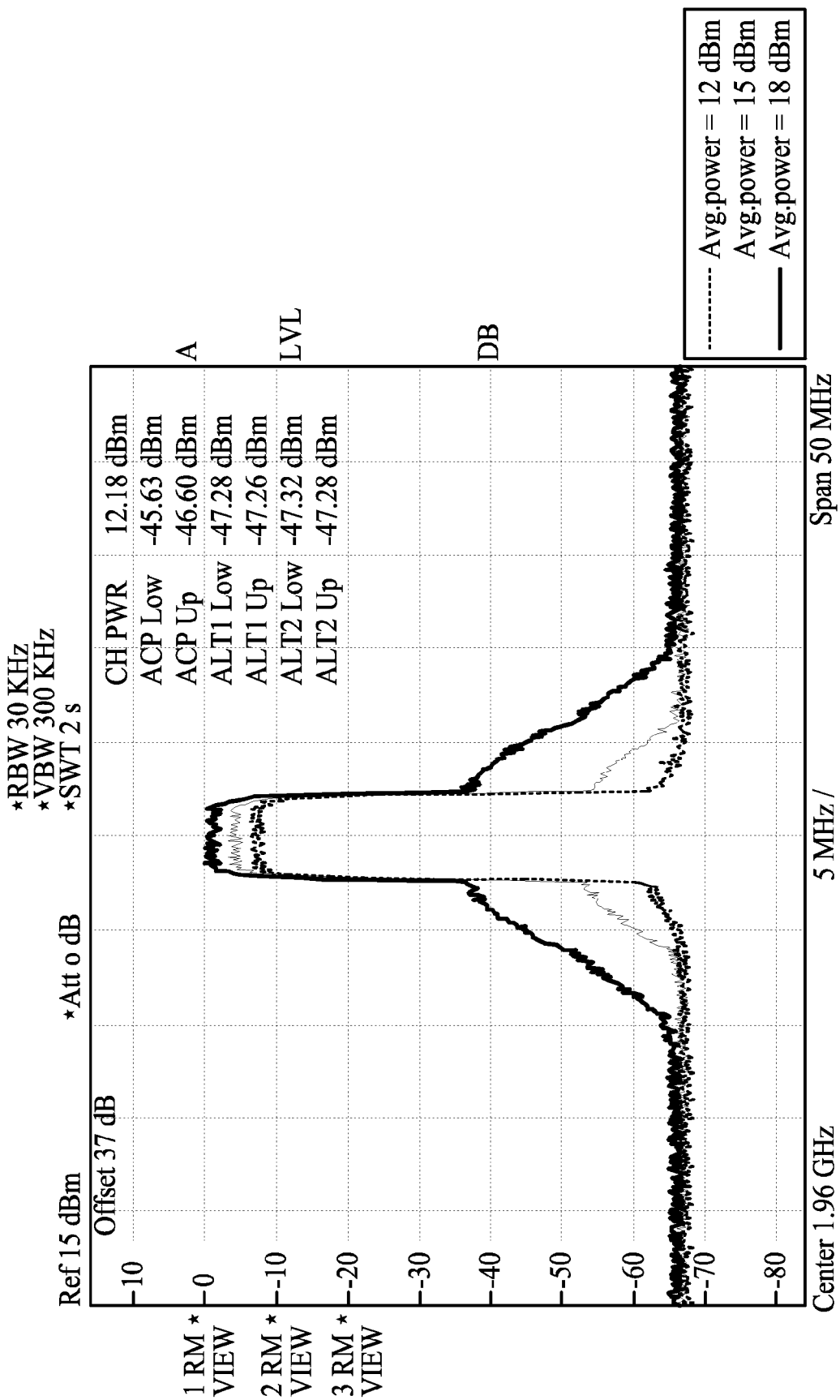
FIGS. 13-15 show the single carrier WCDMA, 3 carrier WCDMA, and CDMA single carrier spectrum re-growth condition for the MMIC with/without a bias current source circuit in nominal 12 dBm, 15 dBm and 18 dBm power outputs.
Figure 14:
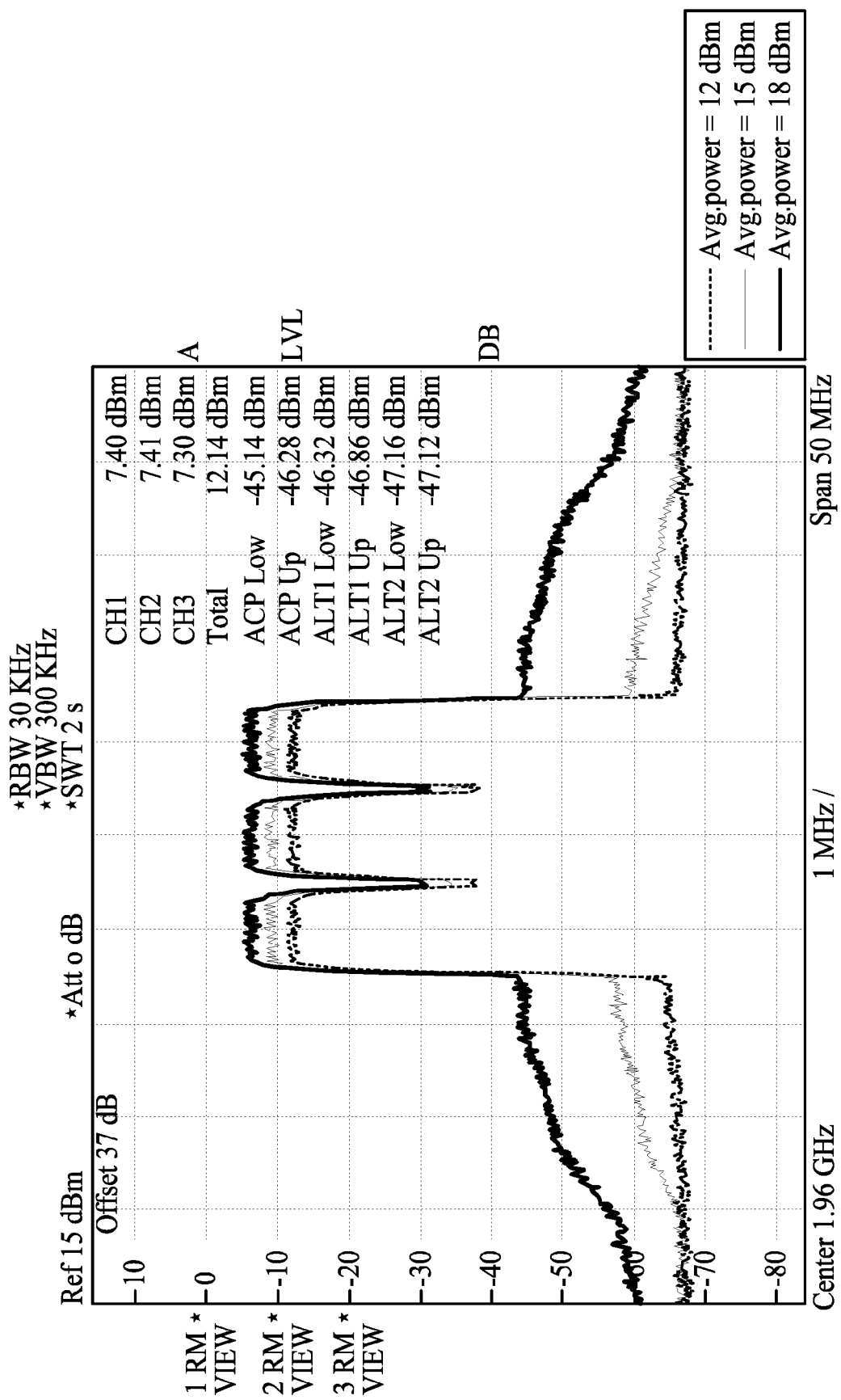
Figure 15:
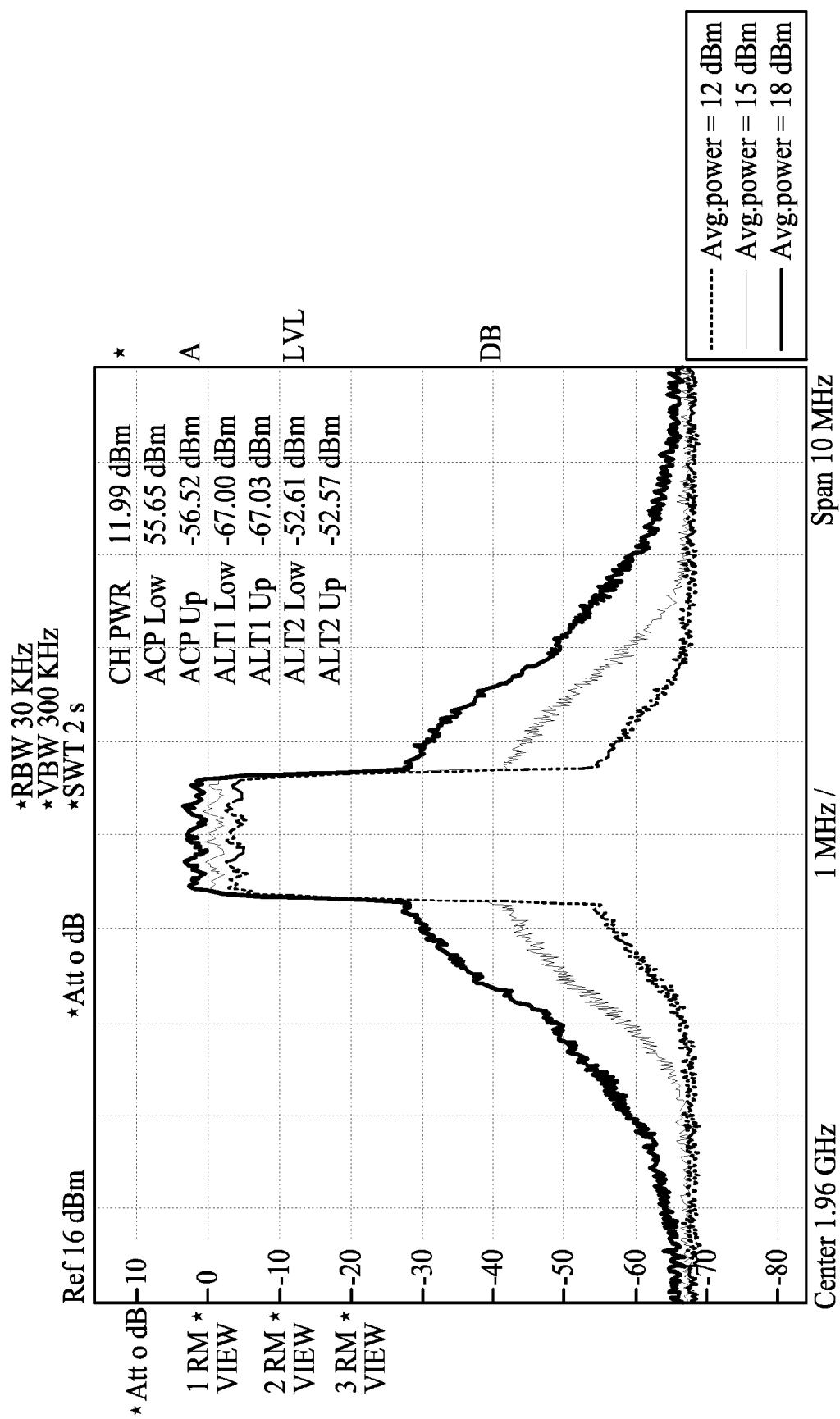

FIGS. 13-15 show the single carrier WCDMA, 3 carrier WCDMA, and CDMA single carrier spectrum re-growth condition for the MMIC with/without a bias current source circuit in nominal 12 dBm, 15 dBm and 18 dBm power outputs. The ACLR has no degradation by this circuit function for all 12 dBm power output conditions. This includes the 11.3 dB PAR without a CFR CDMA carrier. The peak power reaches 23.3 dBm, and the bias current source block can still supply enough peak power current for the high peak portion of the CDMA signals. The non-CFR CDMA outputs have serious distortion at a 15 dBm power level. For WCDMA testing when using CFR to 8.2 dB PAR, the 18 dBm output power has serious distortion by its peak output power level over the MMIC's Psat power capability.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A current source circuit, comprising:
   a first transistor having a first terminal coupled with a supply voltage;
   a first resistor coupled between the supply voltage and a second terminal of the first transistor;
   a second resistor coupled between a third terminal of the first transistor and an output node;
   a second transistor having a first terminal coupled with the second terminal of the first transistor, and a second terminal coupled with the third terminal of the first transistor;
   a third resistor coupled between the second resistor and the output node; and
   a third transistor having a first terminal coupled with a third terminal of the second transistor, and a second terminal coupled with a node between the second resistor and the third resistor.

2. The current source circuit of claim 1, wherein the second terminal of the second transistor is coupled with a node between the third terminal of the first transistor and the second resistor.

3. The current source circuit of claim 1, wherein the second transistor has a third terminal coupled with the output node.

4. The current source circuit of claim 1, wherein the second transistor is configured to decrease a voltage of the output node as a first current flowing through the first transistor increases.

5. The current source circuit of claim 1, wherein the third transistor has a third terminal coupled with the output node.

6. The current source circuit of claim 1, wherein the third transistor is configured to decrease a voltage of the output node as a first current flowing through the first transistor increases.

7. A radio frequency signal amplification system, comprising:
   an amplifier having an input terminal and an output terminal;
   a filtering circuit coupled with the output terminal; and
   a current source circuit configured to supply an operation current to the output terminal of the amplifier through the filtering circuit, comprising:

a first transistor having a first terminal coupled with a supply voltage;

a first resistor coupled between the supply voltage and a second terminal of the first transistor;

a second resistor coupled between a third terminal of the first transistor and the filtering circuit; and a second transistor having a first terminal coupled with the second terminal of the first transistor, and a second terminal coupled with the third terminal of the first transistor.

8. The radio frequency signal amplification system of claim 7, wherein the second terminal of the second transistor is coupled with a node between the third terminal of the first transistor and the second resistor.

9. The radio frequency signal amplification system of claim 7, wherein the second transistor has a third terminal coupled with the filtering circuit.

10. The radio frequency signal amplification system of claim 7, wherein the second transistor is configured to decrease a voltage of the output terminal as the operation current increases.

11. The radio frequency signal amplification system of claim 7, further comprising:

a third resistor coupled between the second resistor and the filtering circuit; and a third transistor having a first terminal coupled with a third terminal of the second transistor, and a second terminal coupled with a node between the second resistor and the third resistor.

12. The radio frequency signal amplification system of claim 7, wherein the third transistor has a third terminal coupled with the filtering circuit.

13. The radio frequency signal amplification system of claim 7, wherein the third transistor is configured to decrease a voltage of the output node as the operation current increases.

14. The radio frequency signal amplification system of claim 7, wherein the current source circuit is configured to limit an average of the operation current in order to not exceed a setting level of the amplifier, and supply a peak current for radio frequency pulse operations of the amplifier.

15. The radio frequency signal amplification system of claim 7, wherein the current source circuit is configured to clamp an average power of the amplifier in order to not exceed a 1 dB compression point ($P_{1\ dB}$).

16. A radio frequency signal amplification system, comprising:

an amplifier having an input terminal and an output terminal;

a filtering circuit coupled with the output terminal; and a current source circuit coupled between a supply voltage and the filtering circuit and configured to supply an operation current to the output terminal of the amplifier through the filtering circuit;

wherein the current source circuit comprises:
 a) a first transistor having a first terminal coupled with the supply voltage;
 b) a first resistor coupled between the supply voltage and a second terminal of the first transistor;
 c) a second resistor coupled between a third terminal of the first transistor and the filtering circuit; and
 d) a second transistor having a first terminal coupled with the second terminal of the first transistor, and a second terminal coupled with the third terminal of the first transistor;

wherein the current source circuit is configured to limit an average of the operation current in order to not exceed a setting level of the amplifier, and supply a peak current for radio frequency pulse operations of the amplifier.

17. The radio frequency signal amplification system of claim 16, wherein the current source circuit is configured to clamp an average power of the amplifier in order to not exceed a 1 dB compression point ($P_{1\ dB}$).

18. The radio frequency signal amplification system of claim 16, wherein the second terminal of the second transistor is coupled with a node between the third terminal of the first transistor and the second resistor.

19. The radio frequency signal amplification system of claim 16, wherein the second transistor has a third terminal coupled with the filtering circuit.

20. The radio frequency signal amplification system of claim 16, wherein the second transistor is configured to decrease a voltage of the output terminal as the operation current increases.

21. The radio frequency signal amplification system of claim 16, further comprising:

a third resistor coupled between the second resistor and the filtering circuit; and a third transistor having a first terminal coupled with a third terminal of the second transistor, and a second terminal coupled with a node between the second resistor and the third resistor.

22. The radio frequency signal amplification system of claim 21, wherein the third transistor has a third terminal coupled with the filtering circuit.

23. The radio frequency signal amplification system of claim 21, wherein the third transistor is configured to decrease a voltage of the output terminal as the operation current increases.

* * * * *